(12) United States Patent
Kim et al.

(10) Patent No.: US 8,410,479 B2
(45) Date of Patent: Apr. 2, 2013

(54) TRANSISTORS, ELECTRONIC DEVICES INCLUDING A TRANSISTOR AND METHODS OF MANUFACTURING THE SAME

(75) Inventors: Sang-wook Kim, Yongin-si (KR); Chang-jung Kim, Yongin-si (KR); Jae-chul Park, Suwon-si (KR); Sun-il Kim, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 170 days.

(21) Appl. No.: 12/805,110

(22) Filed: Jul. 13, 2010

(65) Prior Publication Data

US 2011/0114939 A1    May 19, 2011

(30) Foreign Application Priority Data

Nov. 13, 2009    (KR) .................. 10-2009-0109692

(51) Int. Cl.
*H01L 29/786* (2006.01)
(52) U.S. Cl. .................. 257/43; 257/E29.296; 438/104
(58) Field of Classification Search .................. 257/43, 257/E29.296; 438/104, 85
See application file for complete search history.

(56) References Cited

U.S. PATENT DOCUMENTS

| 7,501,652 | B2 | 3/2009 | Lee et al. | |
| 8,058,645 | B2 * | 11/2011 | Jeong et al. | 257/43 |
| 2008/0191204 | A1 | 8/2008 | Kim et al. | |
| 2008/0296568 | A1 * | 12/2008 | Ryu et al. | 257/43 |
| 2008/0315200 | A1 | 12/2008 | Kim et al. | |
| 2009/0057663 | A1 * | 3/2009 | Kim et al. | 257/43 |
| 2009/0283763 | A1 * | 11/2009 | Park et al. | 257/43 |

FOREIGN PATENT DOCUMENTS

| EP | 2 141 743 A1 | 1/2010 |
| JP | 2008-010889 A | 1/2008 |
| KP | 1993-02411 | 12/1993 |
| KR | 10-0651163 B1 | 11/2006 |
| KR | 10-2007-0043243 A | 4/2007 |
| KR | 10-2008-0074515 A | 8/2008 |

OTHER PUBLICATIONS

European Search Report dated Sep. 22, 2010, in corresponding European Appliction No. 10167828.2.

* cited by examiner

*Primary Examiner* — Julio J Maldonado
*Assistant Examiner* — Daniel Shook
(74) *Attorney, Agent, or Firm* — Harness, Dickey & Pierce, P.L.C.

(57) ABSTRACT

Transistors, electronic devices including a transistor and methods of manufacturing the same are provided, the transistor includes an oxide semiconductor layer (as a channel layer) having compositions that vary in one direction. The channel layer may be an oxide layer including a first element, a second element, and Zn, which are metal elements. The amount of at least one of the first element, the second element, and Zn may change in a deposition direction of the channel layer. The first element may be any one of hafnium (Hf), yttrium (Y), tantalum (Ta), zirconium (Zr), gallium (Ga), aluminum (Al) or combinations thereof. The second element may be indium (In). The channel layer may have a multi-layered structure including at least two layers with different compositions.

26 Claims, 15 Drawing Sheets

< COMPARATIVE EXAMPLE 3 (Hf : 12.1 at%) >

TRANSISTORS, ELECTRONIC DEVICES INCLUDING A TRANSISTOR AND METHODS OF MANUFACTURING THE SAME

CROSS-REFERENCE TO RELATED APPLICATIONS

This application claims the benefit of priority under 35 U.S.C. §119 from Korean Patent Application No. 10-2009-0109692, filed on Nov. 13, 2009, in the Korean Intellectual Property Office, the disclosure of which is incorporated herein in its entirety by reference.

BACKGROUND

1. Field

Example embodiments relate to transistors, electronic devices including a transistor and methods of manufacturing the same.

2. Description of the Related Art

Transistors are widely used as switching devices or driving devices in electronic devices. In particular, thin-film transistors (TFTs) may be formed on a glass substrate, or a plastic substrate. As such, TFTs are widely used in flat panel display devices (e.g., liquid crystal display devices or organic light emitting display devices).

To enhance the operating characteristics of a transistor, an oxide layer having high carrier mobility is used as a channel layer. Such method (namely, the use of an oxide layer) is used in a TFT for a flat panel display device.

In transistors including an oxide layer as a channel layer, the oxide layer is photosensitive, thereby the characteristics of the transistors are easily changed by light.

SUMMARY

Example embodiments relate to transistors, electronic devices including a transistor and methods of manufacturing the same.

Provided are transistors of which the characteristics are not changed by light and methods of manufacturing the same. Provided are electronic devices including the transistors.

Additional aspects will be set forth in part in the description which follows and, in part, will be apparent from the description, or may be learned by practice of the presented example embodiments.

According to example embodiments, a transistor includes a channel layer formed of an oxide including indium (In), zinc (Zn) and a first element, wherein the first element is a metal element. An amount of at least one of the first element, In, and Zn is changed (or varies) in a deposition direction of the channel layer. The transistor includes a source and a drain respectively contacting both (or opposing) ends of the channel layer, a gate formed to correspond to the channel layer, and a gate insulating layer placed between the channel layer and the gate.

The first element may be one selected from the group consisting of hafnium (Hf), yttrium (Y), tantalum (Ta), zirconium (Zr), gallium (Ga), aluminum (Al) and combinations thereof.

The oxide may be an hafnium indium zinc oxide (HfInZnO).

The amount of the first element in the channel layer may increase towards the gate. The amount of In in the channel layer may decrease towards the gate. The amount of Zn in the channel layer may increase towards the gate.

The gate may be formed below the channel layer, and the source and drain may contact portions of a top surface of the channel layer. Alternatively, the gate may be formed above the channel layer, and the source and drain may contact portions of a bottom surface of the channel layer.

According to example embodiments, a transistor includes a channel layer formed of an oxide including In, Zn and a first element, wherein the first element is a metal element. The transistor includes a source and a drain respectively contacting both (or opposing) ends of the channel layer, a gate formed to correspond to the channel layer, and a gate insulating layer placed between the channel layer and the gate. The channel layer may have a multi-layered structure including a first layer and a second layer, wherein an amount of at least one of the first element, In and Zn in the first layer is different from that in the second layer. The oxide may be in the first layer, in the second layer, or in both the first and second layer of the channel layer. The first layer is disposed closer to the gate than the second layer, and the second layer contacts the source and the drain.

The first element may be one selected from the group consisting of Hf, Y, Ta, Zr, Ga, Al and combinations thereof.

The oxide may be HfInZnO.

The amount of the first element may be greater in the first layer than in the second layer. The amount of In may be greater in the second layer than in the first layer. The amount of Zn may be greater in the first layer than the second layer.

The first layer may have a thickness in the range of about 1 nm to about 30 nm, or 1 nm to 30 nm.

The second layer may have a thickness in the range of about 30 nm to about 100 nm, or 30 nm to 100 nm.

The gate may be formed below the channel layer, and the source and drain may contact portions of a top surface of the channel layer. Alternatively, the gate may be formed above the channel layer, and the source and drain may contact portions of a bottom surface of the channel layer.

According to example embodiments, there is provided a flat panel display device including the transistor described above. The flat panel display device may be a liquid crystal display device or an organic light emitting display device. The transistor may be used as a switching device or a driving device.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
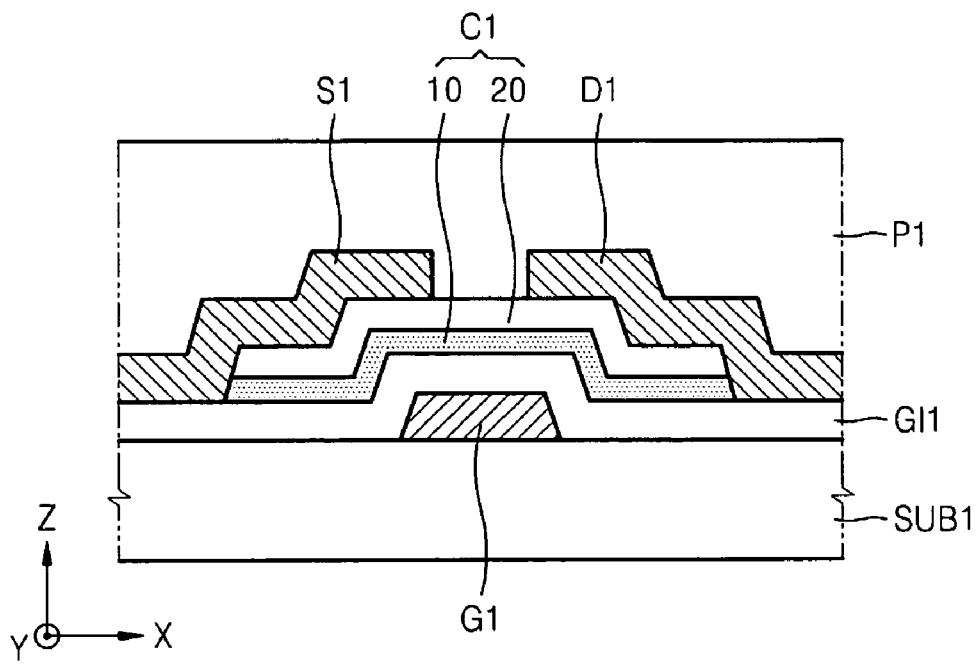
FIG. 1 is a cross-sectional view of a transistor according to example embodiments.

Various example embodiments will now be described more fully with reference to the accompanying drawings in which some embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. For example, a first element could be termed a second element, and, similarly, a second element could be termed a first element, without departing from the scope of example embodiments. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In the drawings, the thicknesses of layers and regions are exaggerated for clarity. Like reference numerals in the drawings denote like elements.

In order to more specifically describe example embodiments, various aspects will be described in detail with reference to the attached drawings. However, the present invention is not limited to example embodiments described.

Example embodiments relate to transistors, electronic devices including a transistor and methods of manufacturing the same.

A transistor, a method of manufacturing the transistor, and an electronic device including the transistor will now be described in more detail with reference to the accompanying drawings.

FIG. 1 is a cross-sectional view of a transistor according to example embodiments.

The transistor shown in FIG. 1 is a bottom-gate thin-film transistor in which a gate G1 is formed below a channel layer C1.

Referring to FIG. 1, the gate G1 may be formed on a substrate SUB1. The substrate SUB1 may be a glass substrate. Alternatively, the substrate SUB1 may be one of various substrates that are commonly used in semiconductor devices (e.g., a plastic substrate and a silicon substrate). The gate G1 may be formed of a general electrode material (e.g., metal or metal oxide). A gate insulating layer GI1 may be formed on the substrate SUB1 to cover the gate G1. The gate insulating layer GI1 may be a silicon oxide layer, a silicon nitride layer or other material layer. The gate insulating layer GI1 may be a high-dielectric material layer having a higher dielectric constant than that of the silicon nitride layer. The gate insulating layer GI1 may have a structure in which at least two layers selected from the group consisting of the silicon oxide layer, the silicon nitride layer and the high-dielectric material layer, are stacked.

The channel layer C1 may be formed on the gate insulating layer GI1. The channel layer C1 may be disposed over the gate G1. The width of the channel layer C1 in the x-axis direction may be greater than that of the gate G1 in the x-axis direction. The channel layer C1 may be an oxide layer with varying compositions in the deposition direction (i.e., in the z-axis direction). The oxide layer constituting the channel layer C1 may be a ZnO-based material layer. For example, the channel layer C1 may be formed of a ZnO-based oxide including a first element A and a second element B (e.g., A-B—Zn—O). The first element A and the second element B may be a metal element. The first element A may be a transition metal (e.g., hafnium (Hf), yttrium (Y), tantalum (Ta), zirconium (Zr) or combinations thereof), or a Group III element (e.g., gallium (Ga) or aluminium (Al)). The second element B may be indium (In).

The composition of the channel layer C1 may vary step by step, or gradually. When the composition of the channel layer C1 varies step by step, the channel layer C1 may include a plurality of oxide layers (or regions) having different compositions from one another. For example, as illustrated in FIG. 1, the channel layer C1 may be a double-layered oxide layer in which a first layer 10 and a second layer 20 are sequentially stacked on the gate insulating layer GI1. The amount of the first element A in the first layer 10 may be different from that of the second layer 20. The amount of the first element A in the first layer 10 may be greater than the amount of the first element A in the second layer 20. When the channel layer C1 is formed of Hf—In—Zn—O, the amount of the first element A in the first layer 10 (i.e., the amount of Hf) may be greater than the amount of Hf in the second layer 20. In this regard, the amount of Hf (at %) may be determined using the following formula $(Hf/(Hf+In+Zn))\times 100$.

The amount of the second element B in the first layer 10 may also be different from the amount of the second element B in the second layer 20. The amount of the second element B (e.g., In) in the second layer 20 may be greater than in the first layer 10. The amount of Zn in the first layer 10 may be different from the amount of Zn in the second layer 20. The amount of Zn in the first layer 10 may be greater than in the second layer 20. As such, a ratio of In to Zn may be lower in the first layer 10 than in the second layer 20. The first layer 10 and the second layer 20 may have a different amount of at least one of the first element A, the second element B and Zn.

The channel layer C1 may have various structures, in addition to the double-layered structure illustrated in FIG. 1. For example, the channel layer C1 may have a structure of multi-layers including at least three layers. In some cases, the channel layer C1 may not have a multi-layered structure. That is, the channel layer C1 may include a single layer in which compositions are gradually changed. In other words, the channel layer C1 may be a layer in which the amount of at least one of the first element A, the second element B and Zn is changed step by step, or gradually in the deposition direction (i.e., in the Z-axis direction). The amount of the first element A in the channel layer C1 may increase towards the gate insulating layer GI1 (or the gate G1). The amount of the second element B in the channel layer C1 may decrease towards the gate insulating layer GI1 (or the gate G1). The amount of Zn in the channel layer C1 may increase towards the gate insulating layer GI1 (or the gate G1). By changing the composition of the channel layer C1 as described above, transistors of which the characteristic(s) change (e.g., changes in a threshold voltage) due to light is suppressed and/or having increased performance characteristics (e.g., mobility) may be manufactured. Such features will be described in more detail later.

When the channel layer C1 has a double-layered structure as illustrated in FIG. 1, the first layer 10 may have a thickness in a wide range of about 1-nm to about 30-nm, or 1-nm to 30-nm. The first layer 10 may have a thickness in a narrow range of about 4-nm to about 20-nm, or 4-nm to 20-nm. The second layer 20 may have a thickness in a range of about 30-nm to about 100-nm, or 30-nm to 100-nm.

A source electrode S1 and a drain electrode D1 that respectively contact both (or opposing) ends of the channel layer C1 may be formed on the gate insulating layer GI1. The source electrode S1 and the drain electrode D1 may be a single metal layer, or a multi-layered metal layer. The source electrode S1 and the drain electrode D1 may be the same, or a different, metal layer as the gate G1.

A passivation layer P1 may be formed above the gate insulating layer GI1 to cover the channel layer C1, the source electrode S1 and the drain electrode D1. The passivation layer P1 may be a silicon oxide layer, a silicon nitride layer or an organic layer. The passivation layer P1 may have a structure in which at least two of these layers are stacked.

The thickness of the gate G1 may be in the range of about 50-nm to about 300 nm. The thickness of the gate insulating layer GI1 may be in the range of about 50-nm to about 400 nm. The thickness of the source electrode S1 may be in the range of about 10-nm to about 200 nm. The thickness of the drain electrode D1 may be in the range of about 10-nm to about 200 nm.

In the channel layer C1, the first layer 10 is disposed closer to the gate G1 than the second layer 20, and the source electrode S1 and the drain electrode D1 are formed on the second layer 20. As such, the first layer 10 may contact the gate insulating layer GI1, and the source electrode S1 and the drain electrode D1 may contact portions of a top surface of the second layer 20.

The mobility of the transistor may be determined by the second layer 20 (on which the source electrode S1 and the drain electrode D1 are formed) more than the first layer 10 contacting the gate insulating layer GI1. On the other hand, the photosensitivity of the transistor may be controlled by the first layer 10 more than the second layer 20. In example embodiments, the channel layer C1 includes a first oxide layer (or region) having a first composition (e.g., the first layer 10 on a contact portion between the channel layer C1 and the gate insulating layer GI1), and a second oxide layer (or region) having a second composition (e.g., the second layer 20 on a contact portion between the channel layer C1 and the source and drain electrodes S1 and D1). In this regard, the first oxide layer may inhibit, or prevent, the characteristics of the transistor from being changed by light, and the second oxide layer may provide a desired high mobility of the transistor. In example embodiments, an oxide transistor having high mobility and of which characteristics are not changed by light may be manufactured.

When light is irradiated to the channel layer C1, excess charges may be generated in the channel layer C1. Changes in the characteristics of the transistor may occur due to the excess charges. It is assumed that the first layer 10 prevents trap sites of the excess charges (i.e., carriers such as electrons or holes) from being formed between the gate insulating layer GI1 and the second layer 20 so as to inhibit, or prevent, a change in the characteristics of the transistor.

Figure 2:
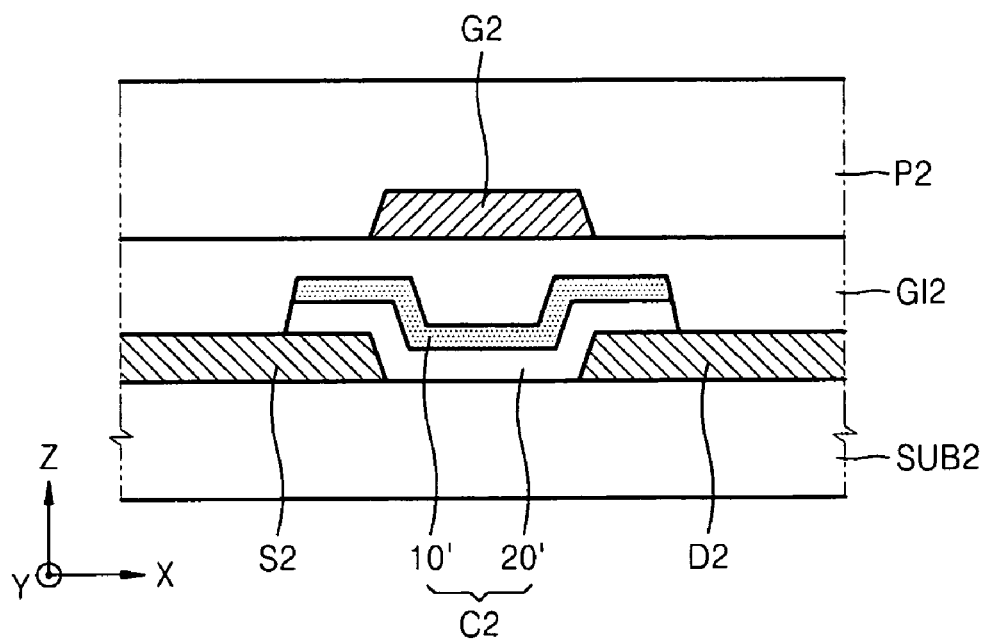
FIG. 2 is a cross-sectional view of a transistor according to example embodiments.

FIG. 2 is a cross-sectional view of a transistor according to example embodiments.

The transistor in FIG. 2 is a top gate thin-film transistor in which a gate G2 is formed above a channel layer C2.

Referring to FIG. 2, a source electrode S2 and a drain electrode D2, which are spaced apart from each other, may be formed on a substrate SUB2. The channel layer C2 contacting the source electrode S2 and the drain electrode D2 may be disposed on the substrate SUB2. Opposing ends of a bottom surface of the channel layer C2 may contact the source electrode S2 and the drain electrode D2, respectively.

The channel layer C2 may have a structure similar to an inverted structure of the channel layer C1 of FIG. 1. For example, the channel layer C2 may have a double-layered structure in which a second layer 20' and a first layer 10' are sequentially stacked. In this regard, the second layer 20' may be equivalent, or similar, to the second layer 20 of FIG. 1, and the first layer 10' may be equivalent, or similar, to the first layer 10 of FIG. 1.

A gate insulating layer GI2 may be formed to cover the channel layer C2, the source electrode S2 and the drain electrode D2. The first layer 10' contacts the gate insulating layer GI2, and the second layer 20' contacts the source electrode S2 and the drain electrode D2. This structure is similar to the structure of FIG. 1 in which the first layer 10 contacts the gate insulating layer GI1, and the second layer 20 contacts the source electrode S1 and the drain electrode D1.

A gate G2 may be formed on the gate insulating layer GI2. The gate G2 may be disposed over the channel layer C2. A passivation layer P2 may be formed on the gate insulating layer GI2 to cover the gate G2.

The material and thickness of each of the substrate SUB2, the source electrode S2, the drain electrode D2, the first layer 10', the second layer 20', the gate insulating layer GI2, the gate G2 and the passivation layer P2 of FIG. 2 may be the same as those of each of the substrate SUB1, the source electrode S1, the drain electrode D1, the first layer 10, the second layer 20, the gate insulating layer GI1, the gate G1 and the passivation layer P1 of FIG. 1. In the transistor of FIG. 2, the first layer 10' also may inhibit the characteristics of the transistor from changing due to light, and the second layer 20' may provide a substantially high mobility to the transistor.

Figure 3:
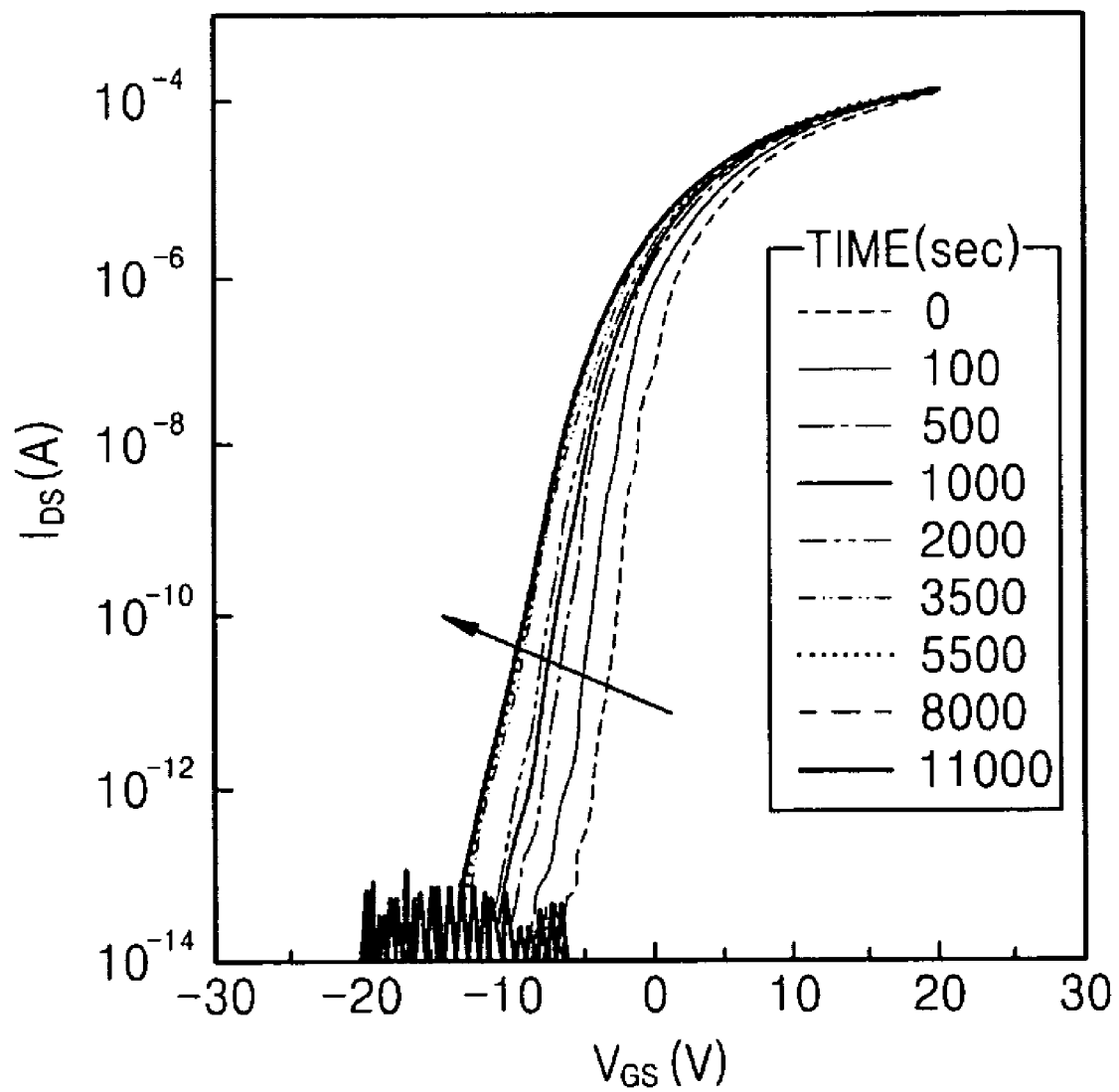
FIGS. 3 through 5 are graphs respectively showing a change, due to light irradiation, in gate voltage ($V_{GS}$) and drain current ($I_{DS}$) characteristics of transistors manufactured according to Comparative Examples 1, 2 and 3.
Figure 4:
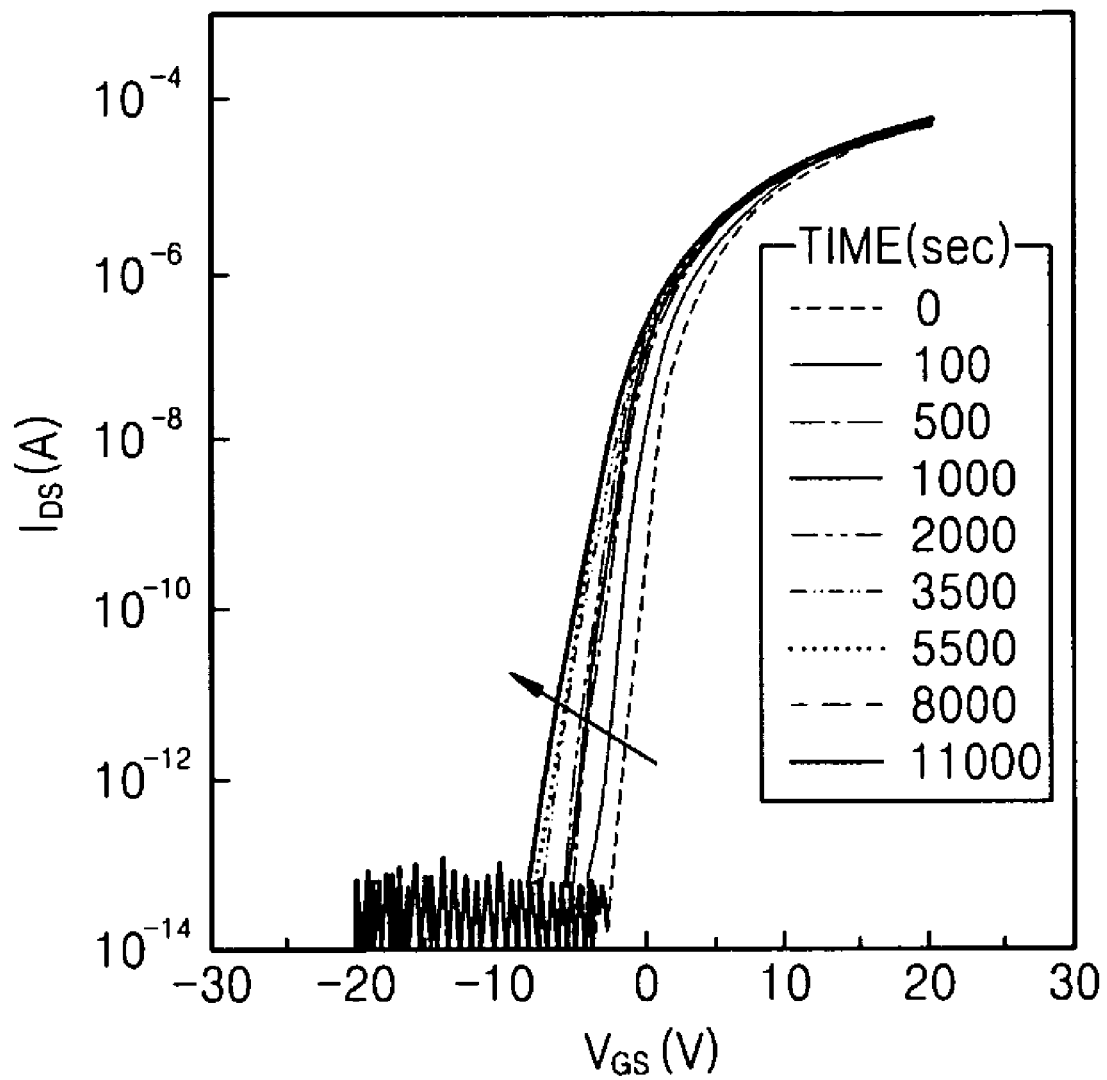
Figure 5:
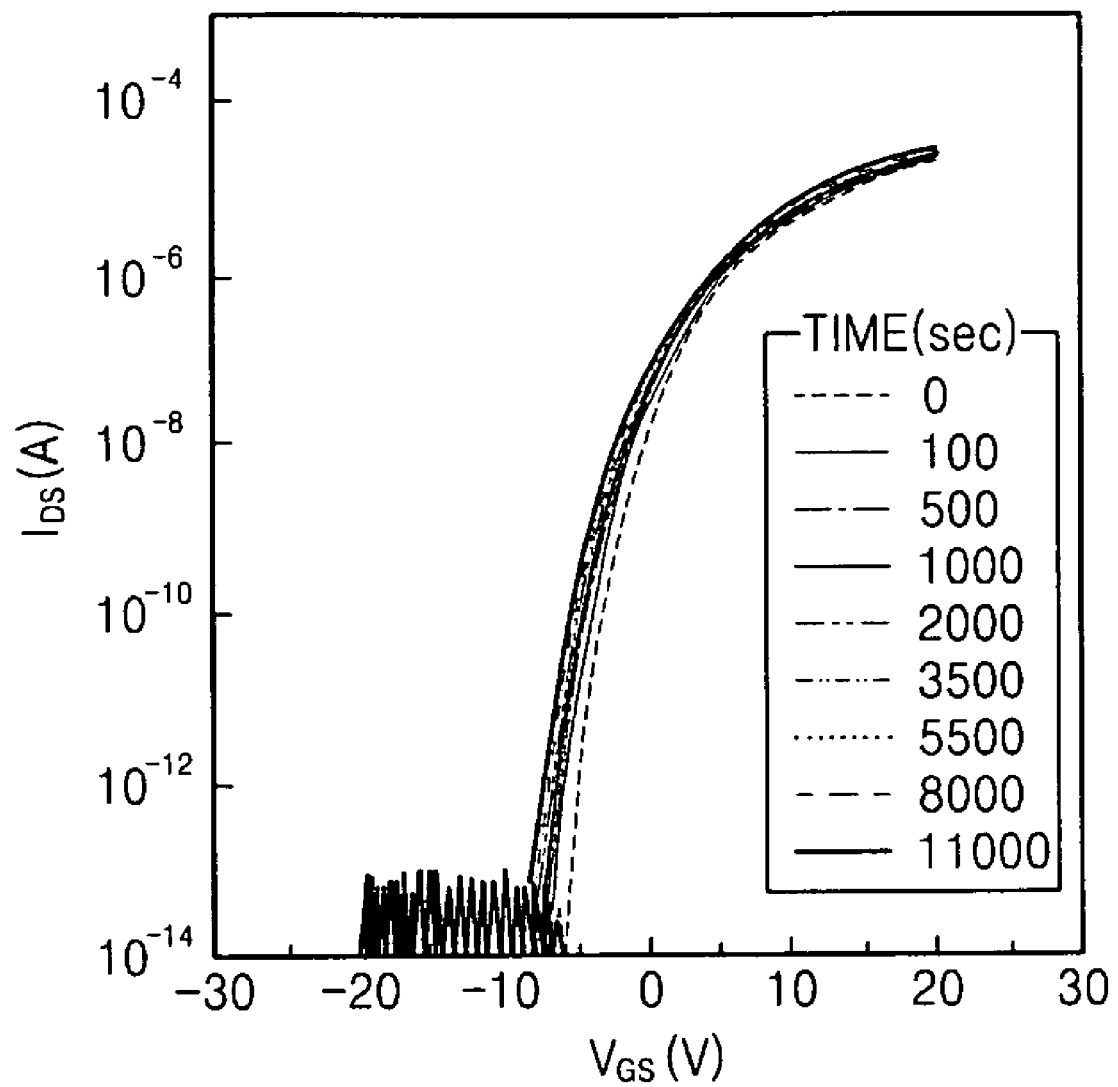

FIGS. 3 through 5 are graphs respectively showing a change, due to light irradiation, in gate voltage ($V_{GS}$) and drain current ($I_{DS}$) characteristics of transistors manufactured according to Comparative Examples 1, 2 and 3.

Each of the transistors of Comparative Examples 1 through 3 has the structure of the transistor of FIG. 1, except that a single layer of Hf—In—Zn—O (having a thickness of about 50-nm) is used as a channel layer. The amount of Hf in the channel layer of the transistor of Comparative Example 1 (FIG. 3) is about 7.5 at %, the amount of Hf in the channel layer of the transistor of Comparative Example 2 (FIG. 4) is about 9.2 at %, and the amount of Hf in the channel layer of the transistor of Comparative Example 3 (FIG. 5) is about 12.1 at %. The amounts of Hf, In, and Zn (at %) in the channel layer (Hf—In—Zn—O single layer) of each of the transistors of Comparative Examples 1 through 3 are shown in Table 1 below. A light of about 20000 nit is irradiated to each transistor and voltages of −20 V, 10 V and 0 V are respectively applied to the gate, the drain electrode and the source electrode at the same time to measure a change in the characteristics of each transistor with respect to time.

TABLE 1

| | Amount of Hf (at %) | Amount of In (at %) | Amount of Zn (at %) |
|---|---|---|---|
| CHANNEL LAYER OF COMPARATIVE EXAMPLE 1 | 7.5 | 51.5 | 41.0 |
| CHANNEL LAYER OF COMPARATIVE EXAMPLE 2 | 9.2 | 54.3 | 36.6 |
| CHANNEL LAYER OF COMPARATIVE EXAMPLE 3 | 12.1 | 52.4 | 35.5 |

Referring to FIGS. 3 through 5, as the time of light irradiation increases, the plots move to the left, meaning that the characteristics (threshold voltage) of the transistors are changed by light irradiation. FIG. 3 shows a large change width between plots, and FIG. 5 shows a small change width between plots. This means that, if the Hf—In—Zn—O single layer is used as the channel layer, then the change in the characteristics of a transistor by light is smaller when the amount of Hf is greater. When the amount of Hf is greater, the mobility of the transistor is lower.

Figure 6:
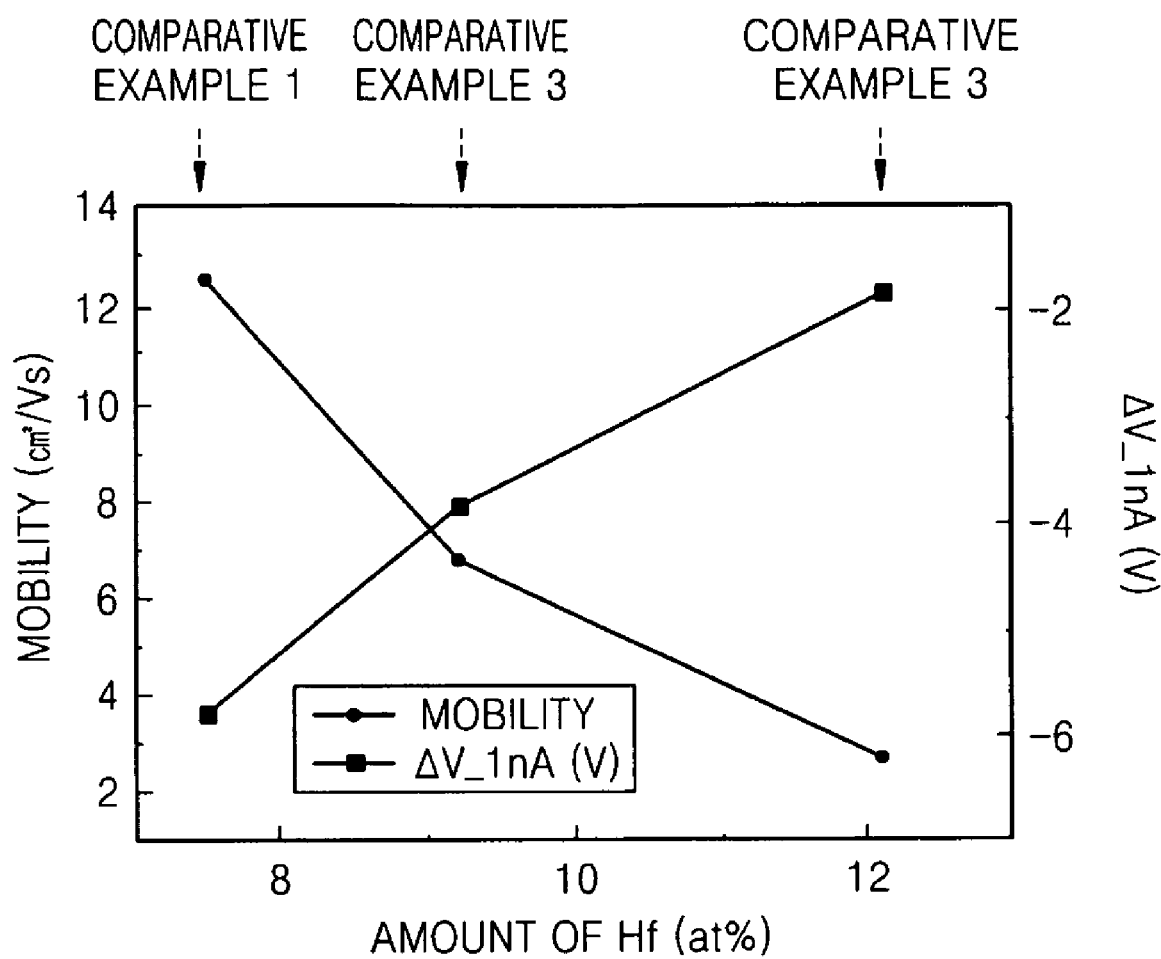
FIG. 6 is a graph showing the mobilities and photosensitivities ("$\Delta V\_1$ nA") of transistors manufactured according to Comparative Examples 1 through 3.

FIG. 6 is a graph showing the mobilities and photosensitivities ("$\Delta V\_1$ nA") of the transistors manufactured according to Comparative Examples 1 through 3.

In FIG. 6, $\Delta V\_1$ nA denotes a difference between $V\_1$ nA before light irradiation and $V\_1$ nA after light irradiation (i.e., ($V\_1$ nA$_{after}$−$V\_1$ nA$_{before}$). In this regard, '$V\_1$ nA' denotes a gate voltage at which a current of 1 nA flows between source and drain electrodes. The $\Delta V\_1$ nA of FIG. 6 is measured by irradiating a light of about 20000 nits to each transistor for about 11,000 seconds. While the light is irradiated, −20V, 10V and 0V are respectively applied to the gate, the drain electrode and the source electrode. The greater an absolute value of $\Delta V\_1$ nA, the more the characteristics of the transistor are changed by light.

Referring to FIG. 6, in the transistors of Comparative Examples 1 through 3 (which include an Hf—In—Zn—O single layer as a channel layer), the greater the amount of Hf in the channel layer, the smaller the absolute value of $\Delta V\_1$ nA. As such, when the amount of Hf is greater, the reliability of the transistor with respect to light and voltage stress increases. On the other hand, the greater the amount of Hf, the lower the mobility of a transistor. The transistor of Comparative Example 1 (including an Hf—In—Zn—O single layer as a channel layer in which the amount of Hf is low) has a substantially high mobility and a substantially low reliability with respect to light and voltage stress. The transistor of Comparative Example 3 (including a Hf—In—Zn—O single layer as a channel layer in which the amount of Hf is high) has high reliability with respect to light and voltage stress and low mobility. From these results, it can be seen that when the Hf—In—Zn—O single layer is used as a channel layer, it is difficult to obtain a transistor with substantially high mobility and/or reliability with respect to light and voltage stress.

Figure 7:
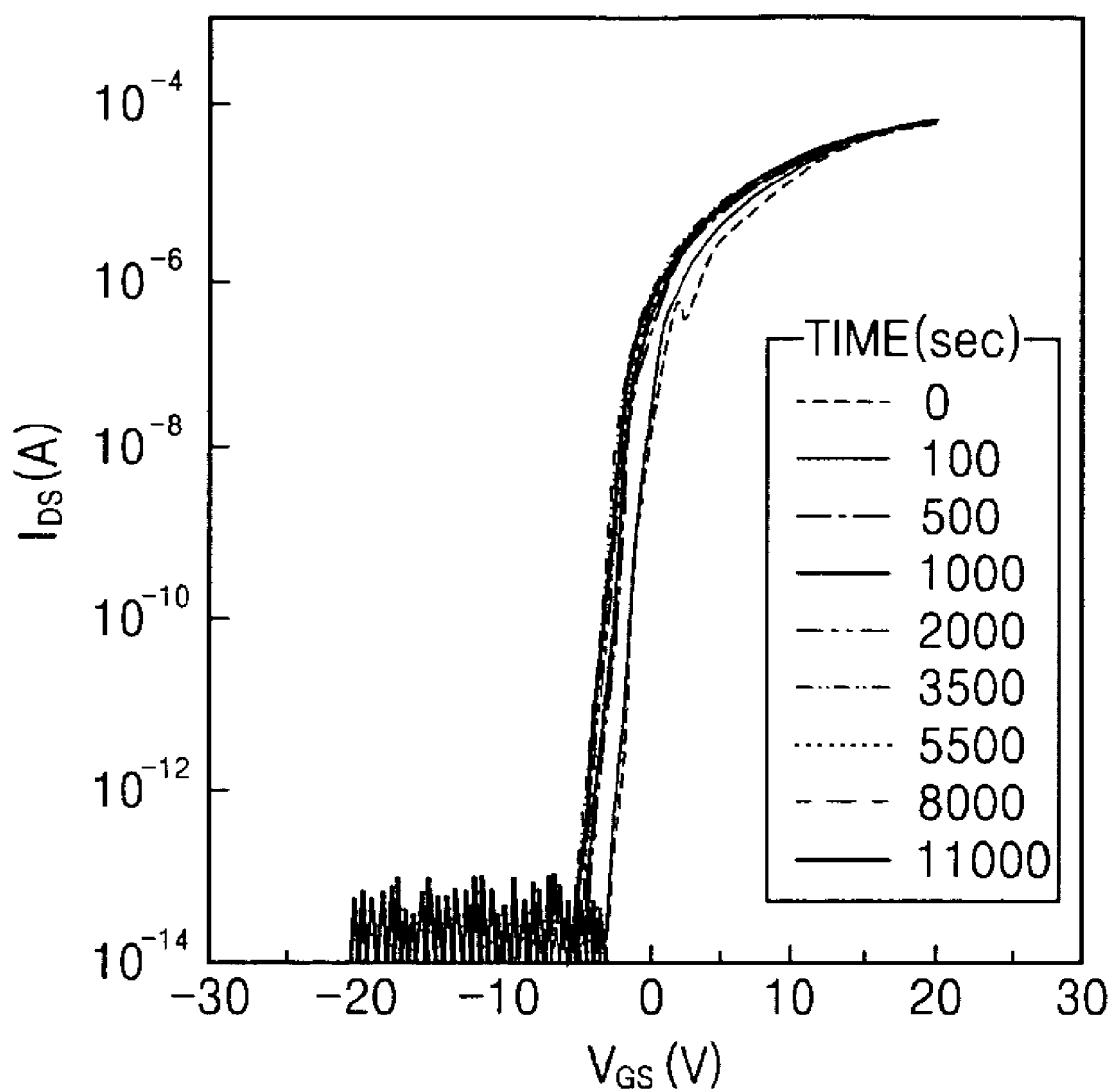
FIG. 7 is a graph showing a change, due to light irradiation, in gate voltage $V_{GS}$ and drain current $I_{DS}$ characteristics of a transistor manufactured according to example embodiments.

FIG. 7 is a graph showing a change, due to light irradiation, in gate voltage $V_{GS}$ and drain current $I_{DS}$ characteristics of a transistor manufactured according to example embodiments.

The transistor, of Example 1 has the structure of the transistor illustrated in FIG. 1. In this regard, the channel layer C1 is formed of Hf—In—Zn—O, and the amount of Hf in the first layer 10 is 12.1 at % and the amount of Hf in the second layer 20 is 7.5 at %. The composition of the first layer 10 is the same as that of the channel layer of the transistor of Comparative Example 3 (refer to Table 1), and the composition of the second layer 20 is the same as that of the channel of the transistor of Comparative Example 1 (refer to Table 1). In other words, the first layer 10 is formed of a composition suitable for enhancing the reliability with respect to light and voltage stress (the composition of the channel layer of the transistor of Comparative Example 3), and the second layer 20 is formed of a composition suitable for enhancing the mobility of a transistor (the composition of the channel layer of the transistor of Comparative Example 1). The thickness of the first layer 10 is about 10-nm, and the thickness of the second layer 20 is about 40-nm. Light irradiation and voltage stress conditions to obtain the graph of FIG. 7 for the transistor of Example are the same as described above with reference to FIGS. 3 through 5.

Referring to FIG. 7, a change in characteristics of the transistor of Example 1 by light is small. This result is similar to that of the transistor of Comparative Example 3 illustrated in FIG. 5. On the other hand, the transistor of Example 1 has a relatively high mobility (i.e., about 10 cm²/Vs). As such, according to example embodiments, a transistor with a substantially high mobility and high reliability with respect to light and voltage stress can be obtained.

Figure 8:
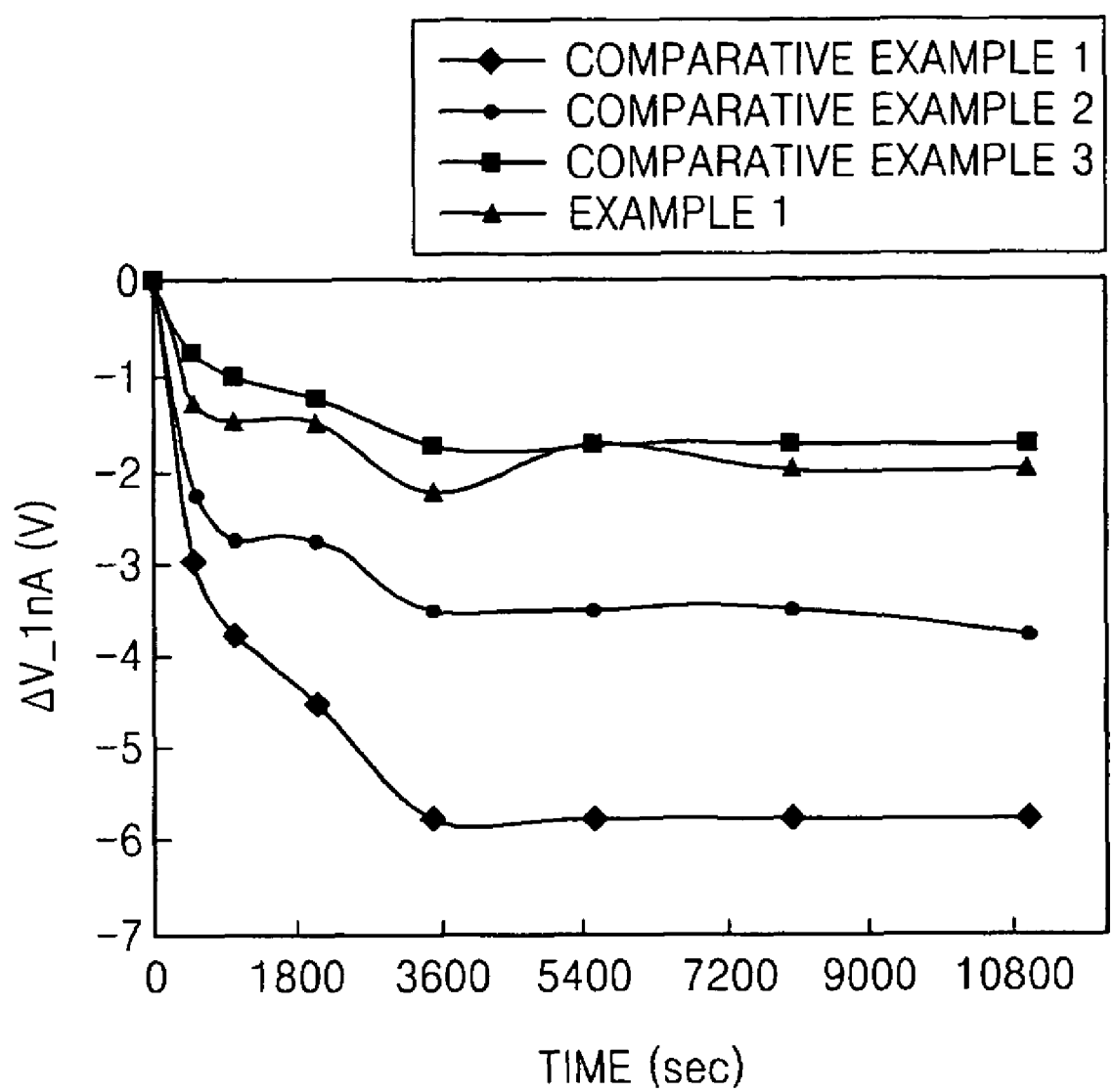
FIG. 8 is a graph showing a change, due to light irradiation under voltage stress, in characteristics ("$\Delta V\_1$ nA") of transistors manufactured according to Comparative Examples 1 through 3 and example embodiments.

FIG. 8 is a graph showing a change in characteristics ("$\Delta V\_1$ nA") of transistors manufactured in Comparative Examples 1 through 3 and Example 1, by light irradiation under voltage stress.

All of the results of FIGS. 3 through 5 and 7 are combined and illustrated in the graph of FIG. 8. A detailed description of "$\Delta V\_1$ nA" has already been provided above with reference to FIG. 6.

Referring to FIG. 8, in the transistor of Comparative Example 1, $\Delta V\_1$ nA decreases to about −6.0 V about 1 hour (3600 seconds) after light irradiation under voltage stress. In the transistor of Comparative Example 2, $\Delta V\_1$ nA decreases to about −3.5 V about 1 hour (3600 seconds) after light irradiation under voltage stress. This means that a change in the threshold voltage of the transistor of Comparative Example 1 is about 6.0 V approximately 1 hour after light irradiation, and a change in the threshold voltage of the transistor of Comparative Example 2 is about 3.5 V approximately 1 hour after light irradiation. On the other hand, in the transistor of Example 1, a change of $V\_1$ nA is relatively small (as similarly in the case of the transistor of Comparative Example 3), meaning that a change in the characteristics of the transistor of Example 1 by light irradiation is small even under voltage stress. In other words, it can be seen that the transistor of Example 1 almost has as high reliability with respect to light and voltage stress as the transistor of Comparative Example 3.

Figure 9:
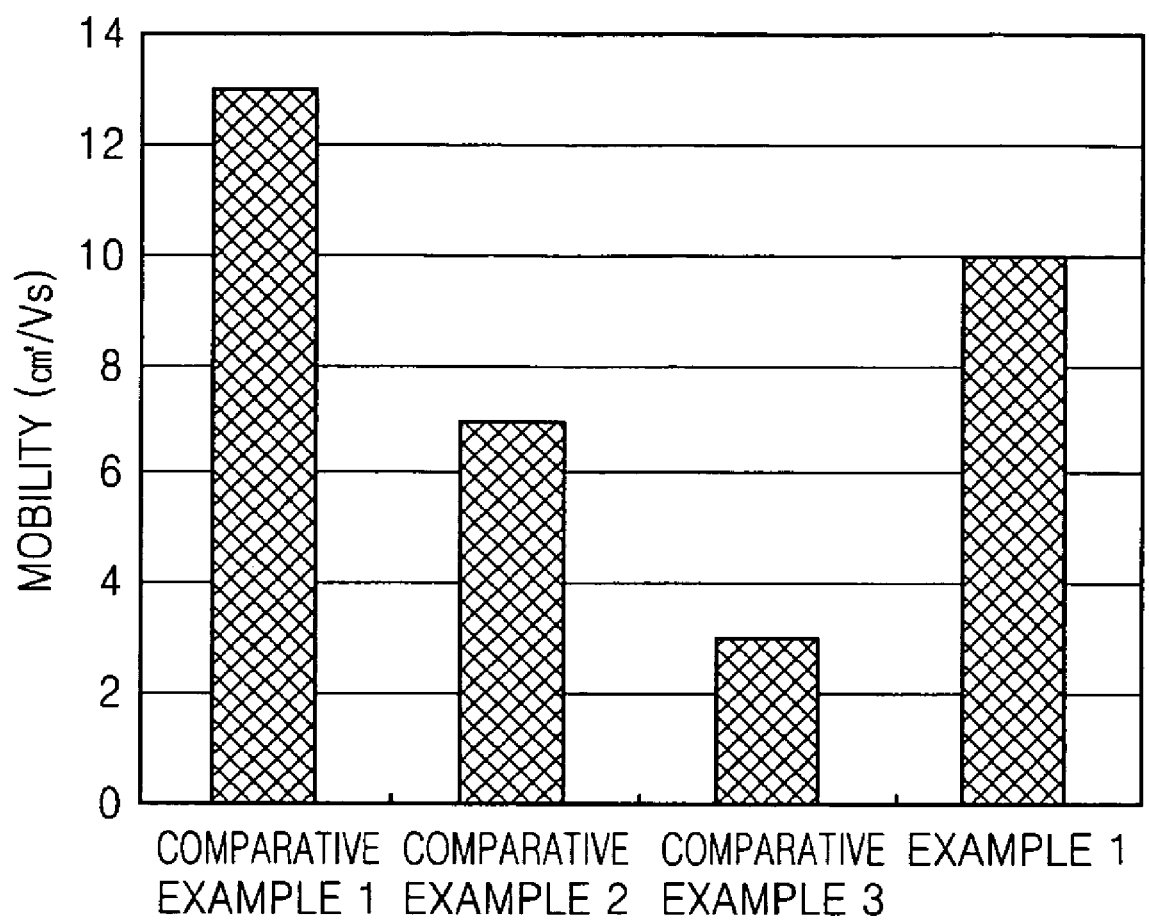
FIG. 9 is a graph showing the mobilities of transistors manufactured according to Comparative Examples 1 through 3 and example embodiments.

FIG. 9 is a graph showing the mobilities of transistors manufactured according to Comparative Examples 1 through 3 and Example 1 (FIG. 7).

The test results of the transistors of Comparative Examples 1 through 3 in FIG. 9 are the same as the results thereof illustrated in FIG. 6.

Referring to FIG. 9, the transistor of Example 1 has as a substantially high mobility, similar to the transistor of Comparative Example 1.

From these results, according to example embodiments, an oxide transistor with a substantially high mobility and of which characteristic change due to light is suppressed may be obtained.

Figure 10:
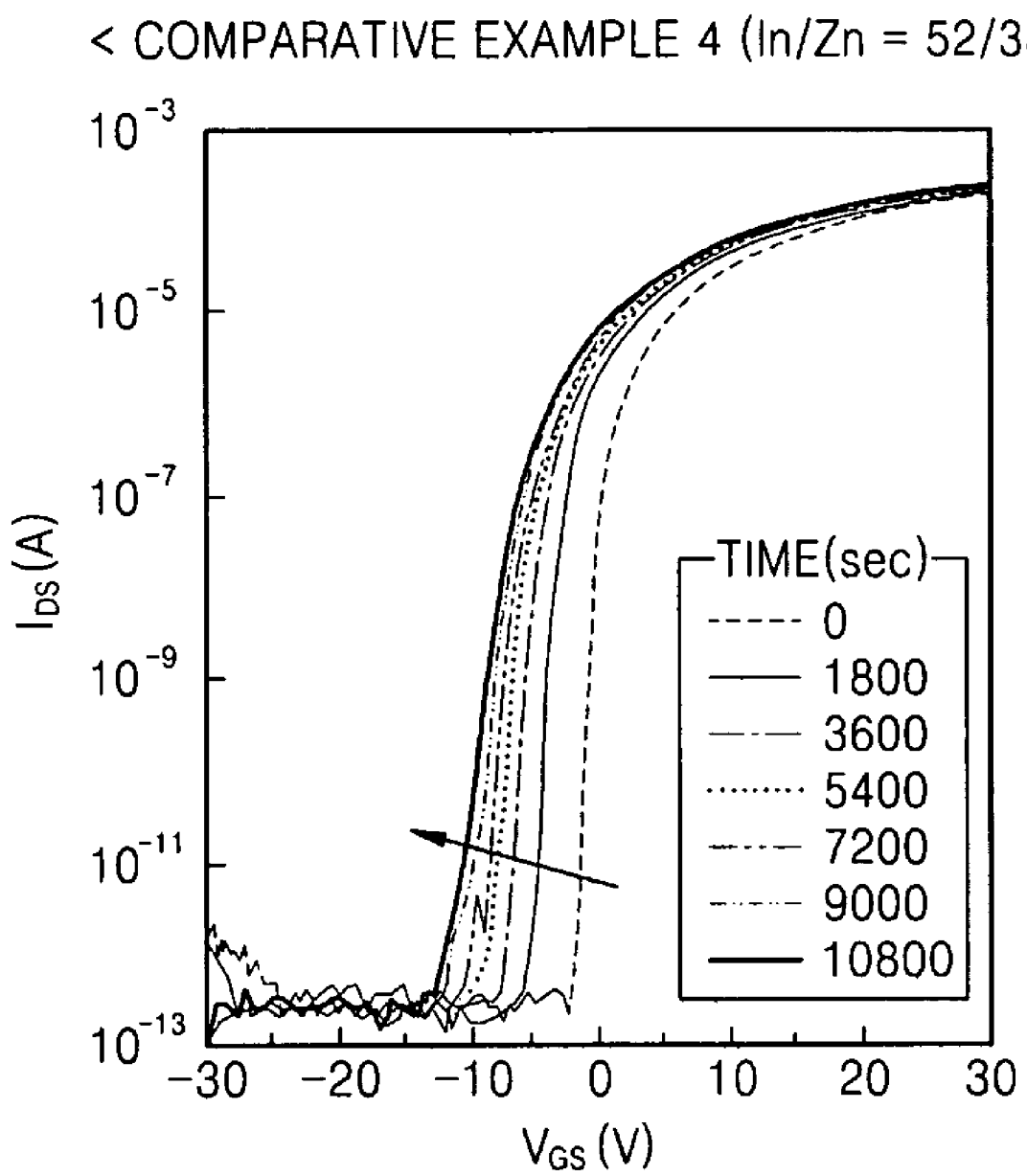
FIGS. 10 through 12 are graphs respectively showing a change, due to light irradiation, in $V_{GS}$ and $I_{DS}$ characteristics of transistors manufactured according to Comparative Examples 4, 5, and 6.
Figure 11:
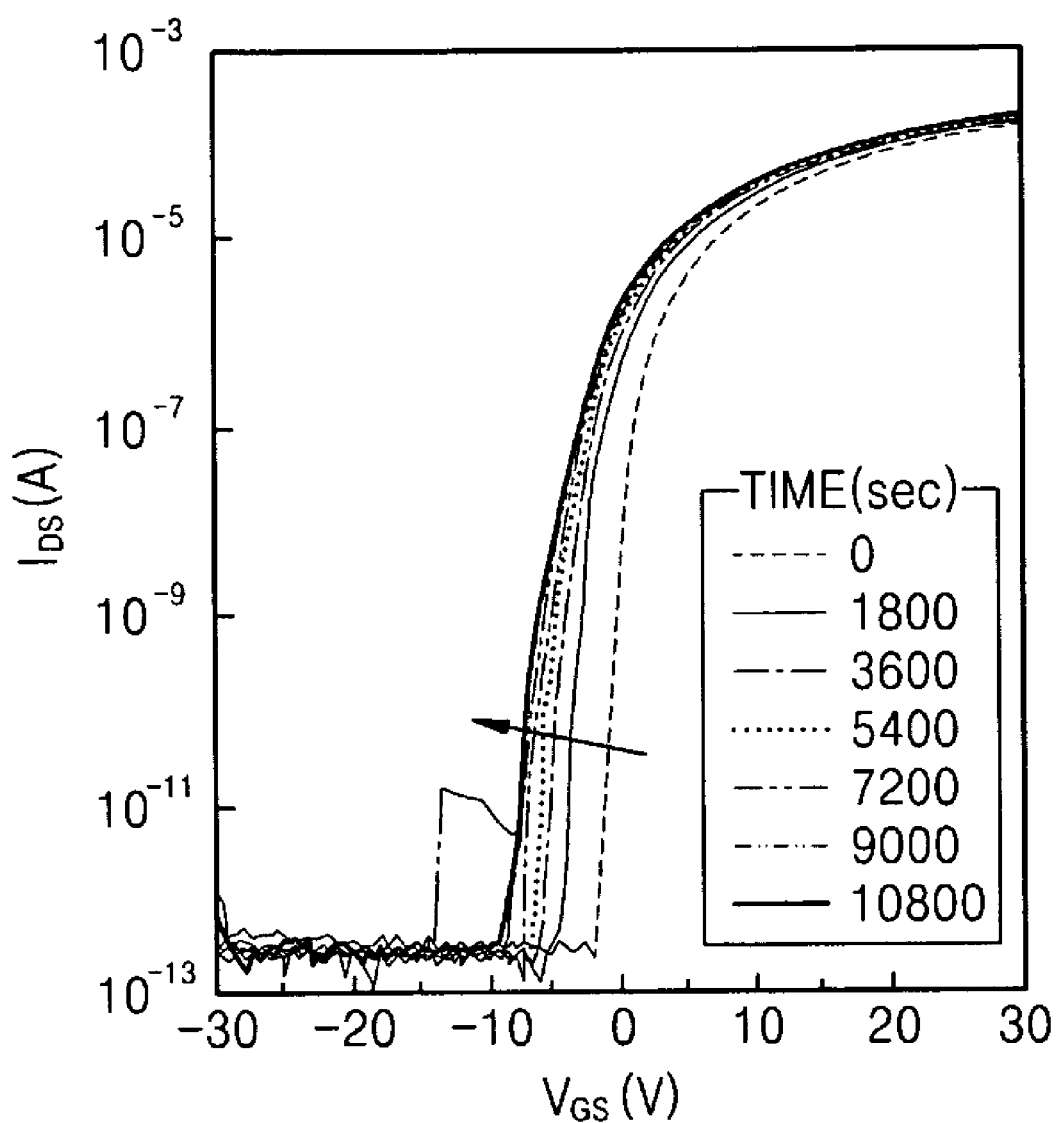
Figure 12:
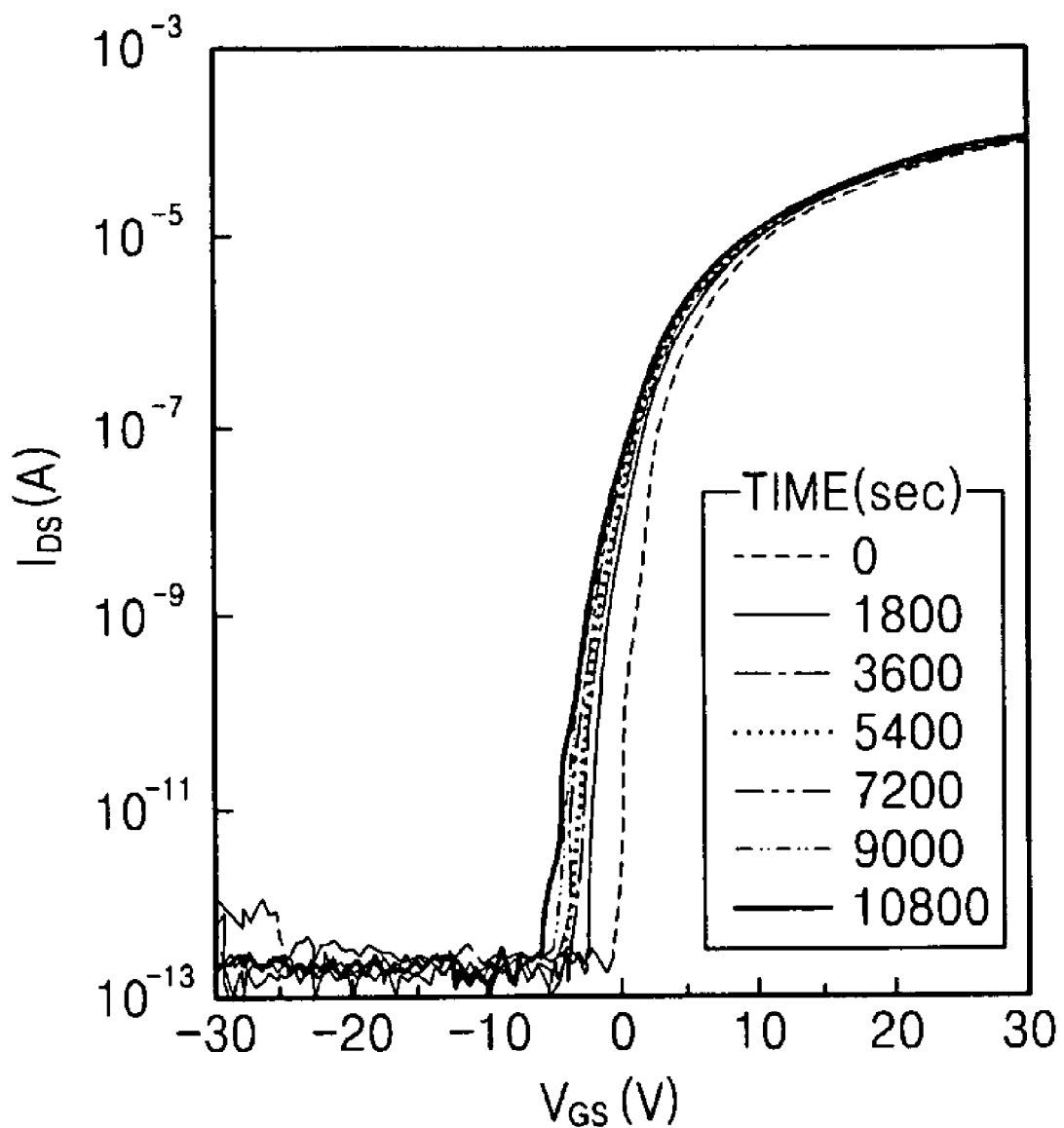

FIGS. 10 through 12 are graphs respectively showing a change, due to light irradiation, in $V_{GS}$ and $I_{DS}$ characteristics of transistors manufactured according to Comparative Examples 4, 5 and 6.

Each of the transistors of Comparative Examples 4 through 6 has the structure of the transistor illustrated in FIG. 1, except that a Hf—In—Zn—O single layer (having a thickness of about 50 nm) is used as a channel layer. The amounts of In to Zn in the channel layers of the transistors of Comparative Examples 4 through 6 are 52:38, 45:45 and 34:56, respectively, and the amounts of Hf are all the same in the channel layers thereof (i.e., 10 at %). The amounts of Hf, In and Zn in the channel (Hf—In—Zn—O single layer) of each transistor are shown in Table 2 below. A light of about 20000 nit is irradiated to each transistor and voltages of −20 V, 10 V and 0 V are respectively applied to the gate, the drain electrode and the source electrode at the same time to measure a change in characteristics of each transistor with respect to time.

TABLE 2

| | Amount of Hf (at %) | Amount of In (at %) | Amount of Zn (at %) |
|---|---|---|---|
| CHANNEL LAYER OF COMPARATIVE EXAMPLE 4 | 10 | 52 | 38 |
| CHANNEL LAYER OF COMPARATIVE EXAMPLE 5 | 10 | 45 | 45 |
| CHANNEL LAYER OF COMPARATIVE EXAMPLE 6 | 10 | 34 | 56 |

Referring to FIGS. 10 through 12, as the time of light irradiation increases, the plots move to the left. FIG. 10 shows a large change in the width between plots, and FIG. 12 shows a small change in the width between plots. This means that, if the Hf—In—Zn—O single layer is used as the channel layer, then a change in the characteristics of the transistor by light is smaller as the amount ratio of In to Zn decreases.

Figure 13:
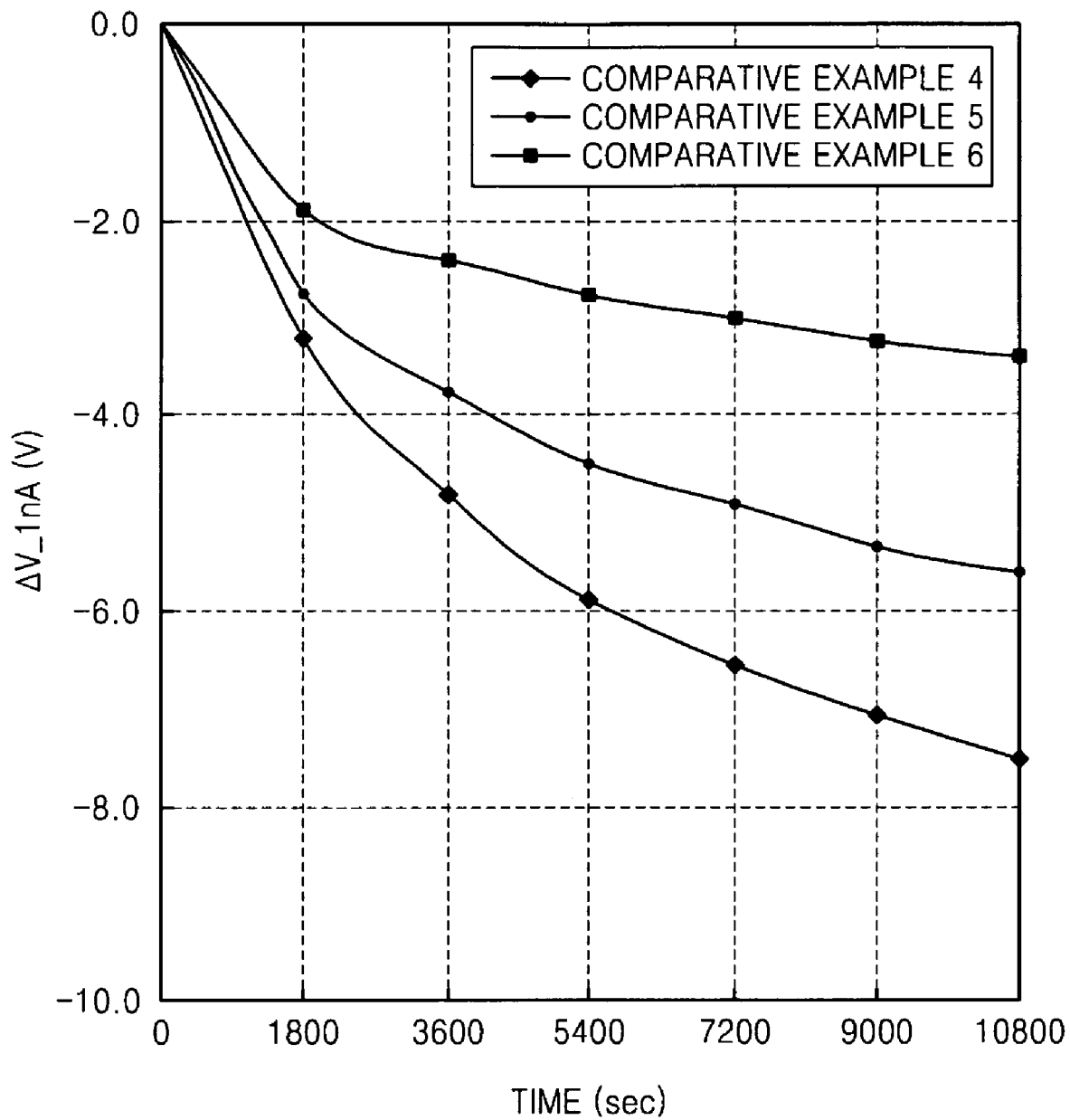
FIG. 13 is a graph showing a change, due to light irradiation under voltage stress, in characteristics ("$\Delta V\_1\ nA$") of transistors manufactured according to Comparative Examples 4 through 6.

The results of FIGS. 10 through 12 are combined and illustrated in the graph of FIG. 13.

FIG. 13 is a graph showing a change, due to light irradiation under voltage stress, in characteristics ("$\Delta V\_1$ nA") of transistors manufactured in Comparative Examples 4 through 6.

Referring to FIG. 13, the transistor of Comparative Example 6 has a relatively smaller change of $V\_1$ nA than in the transistors of Comparative Examples 4 and 5, meaning that the transistor of Comparative Example 6 has a substantially high reliability with respect to light and voltage stress. In other words, the transistor including the channel layer (Hf—In—Zn—O single layer) in which the amount ratio of In to Zn is low may have a substantially high reliability with respect to light and voltage stress. However, when the Hf—In—Zn—O single layer in which the amount ratio of In to Zn is low is used as a channel layer, the mobility of the transistor may be low.

Figure 14:
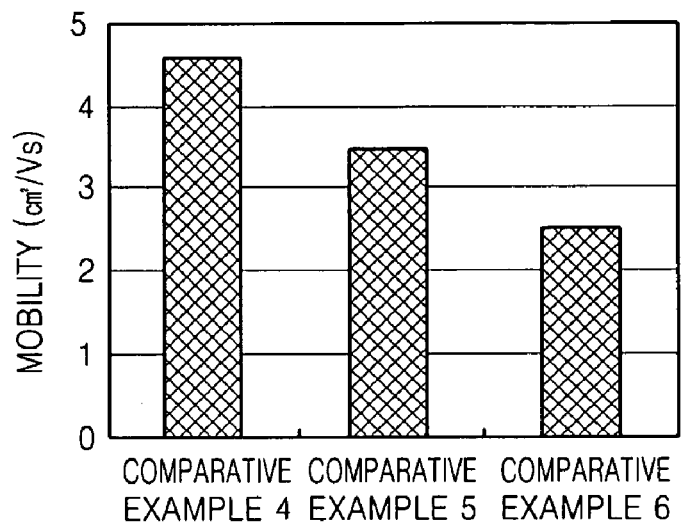
FIG. 14 is a graph showing the mobilities of transistors manufactured according to Comparative Examples 4 through 6.

FIG. 14 is a graph showing the mobilities of transistors manufactured according to Comparative Examples 4 through 6.

Referring to FIG. 14, the mobilities of the transistors decrease towards Comparative Example 6 from Comparative Example 4. In other words, the smaller the amount ratio of In to Zn (that is, the smaller the amount of In and the greater the amount of Zn), the lower the mobility of the transistor. In terms of mobility, the channel layer of the transistor of Comparative Example 4 in which the amount ratio of In to Zn is substantially high may be suitable. The amount of Hf in the channel layer (Hf—In—Zn—O single layer) of each transistor of FIG. 14 is 10 at %. If the amount of Hf varies, the mobility of each transistor may also vary. For example, if the amount of Hf decreases to about 7 at %, the mobility of each transistor may increase up to more than twice than before.

In transistors according to example embodiments, a channel layer may be formed as a double layer, and include a first layer (first layer 10 of FIG. 1 or 10' of FIG. 2) having compositions suitable for enhancing reliability with respect to light and voltage stress like the channel layer of the transistor of Comparative Example 6 and a second layer (second layer 20 of FIG. 1 or 20' of FIG. 2) having compositions suitable for enhancing mobility like the channel layer of the transistor of Comparative Example 4. A transistor with substantially high mobility and/or substantially high reliability with respect to light and voltage stress may be obtained. In other words, by using the same amount of Hf and varying the composition of In and/or Zn in the channel layer, a transistor with substantially high mobility and substantially high reliability with respect to light and voltage stress may be obtained.

A method of manufacturing a transistor according to example embodiments will now be described.

Figure 15A:
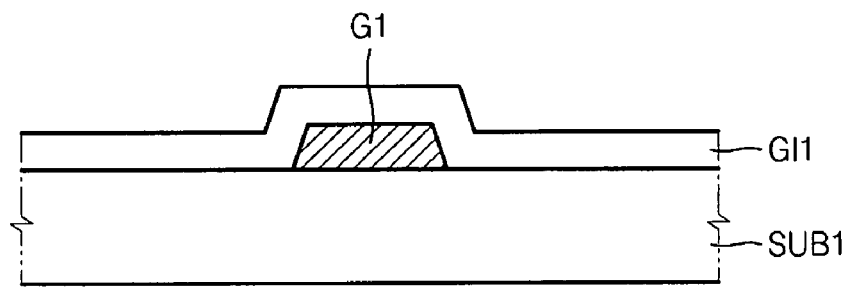
FIGS. 15A through 15C are cross-sectional views sequentially showing a method of manufacturing a transistor according to example embodiments.
Figure 15B:
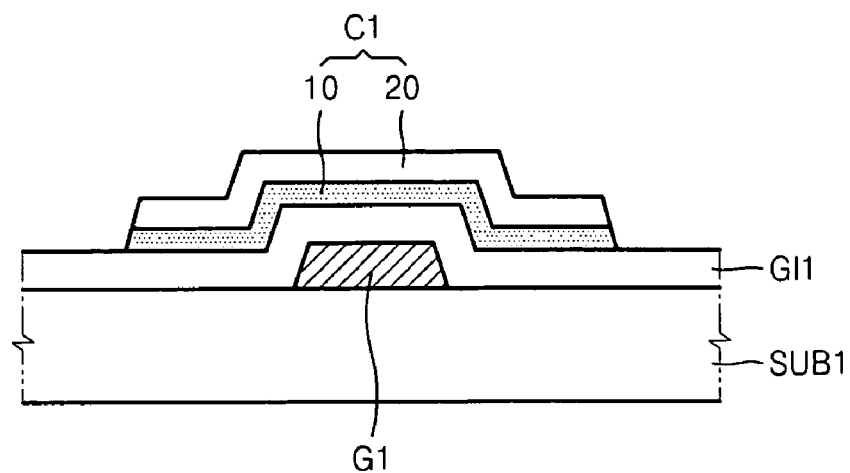
Figure 15C:
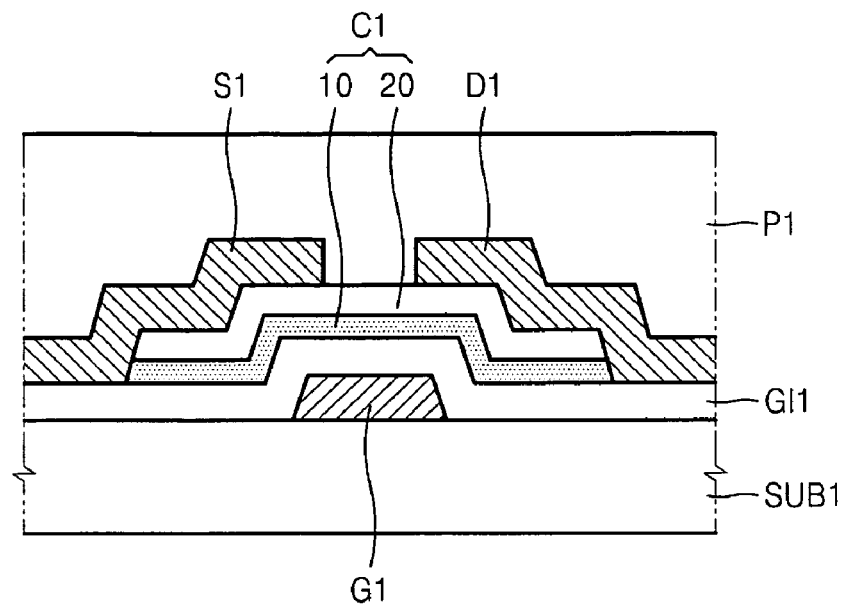

FIGS. 15A through 15C are cross-sectional views sequentially showing a method of manufacturing a transistor according to example embodiments.

In FIGS. 15A through 15C, the transistor is a bottom gate thin-film transistor. In FIGS. 1 and 15A through 15C, like reference numerals denote like elements.

Referring to FIG. 15A, a gate G1 may be formed on a substrate SUB1, and a gate insulating layer GI1 may be formed to cover the gate G1. The gate insulating layer GI1 may be a silicon oxide layer, a silicon nitride layer or other material layer(s) (e.g., a high-dielectric material layer having a higher dielectric constant than that of the silicon nitride layer). In addition, the gate insulating layer GI1 may have a structure in which at least two layers selected from the group consisting of the silicon oxide layer, the silicon nitride layer and the high-dielectric material layer, are stacked.

Referring to FIG. 15B, a channel layer C1 may be formed on the gate insulating layer GI1, and the channel layer C1 may have compositions that vary in the deposition direction (in a direction from a bottom surface to a top surface, or vice versa) of the channel layer C1. The channel layer C1 may include a plurality of layers that are sequentially stacked. For example, the channel layer C1 may include a first layer 10 and a second layer 20 that are sequentially stacked.

The first layer 10 and the second layer 20 may be formed of different compositions. The first layer 10 and the second layer 20 may be formed by physical vapor deposition (PVD) (e.g., sputtering or evaporation), and may be patterned layers using the same mask layer. The first layer 10 may have a thickness in the range of about 1-nm to about 30-nm, or 1-nm to 30-nm. The first layer 10 may have a thickness in the range of about 4-nm to about 20-nm, or 4-nm to 20-nm. The second layer 20 may have a thickness in the range of about 30-nm to about 100-nm, or 30-nm to 100-nm.

The materials and compositions of the channel layer C1 may be the same as those of the channel layer C1 of FIG. 1, and thus a detailed description thereof is not repeated herein for the sake of brevity.

Referring to FIG. 15C, a source electrode S1 and a drain electrode D1 may be formed on the gate insulating layer GI1 to respectively contact both (or opposing) ends of the channel layer C1 and expose a portion of the top surface of the channel layer C1. The source electrode S1 and the drain electrode D1 may be formed as a single metal layer, or a multi-layered metal layer. A passivation layer P1 may be formed on the substrate SUB1 to cover the exposed portion of the channel layer C1, the source electrode S1 and the drain electrode D1. The passivation layer P1 may be a silicon oxide layer, a silicon nitride layer or an organic layer. The passivation layer P1 may have a structure in which at least two of these layers are stacked. The transistor manufactured using the above-described method may be annealed at a given (or threshold) temperature.

Figure 16A:
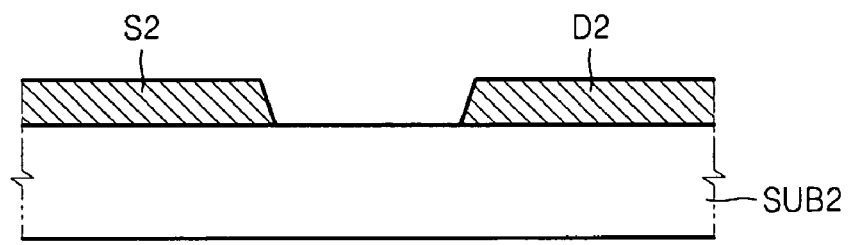
FIG. 16A through 16C are cross-sectional views sequentially showing a method of manufacturing a transistor according to example embodiments.
Figure 16B:
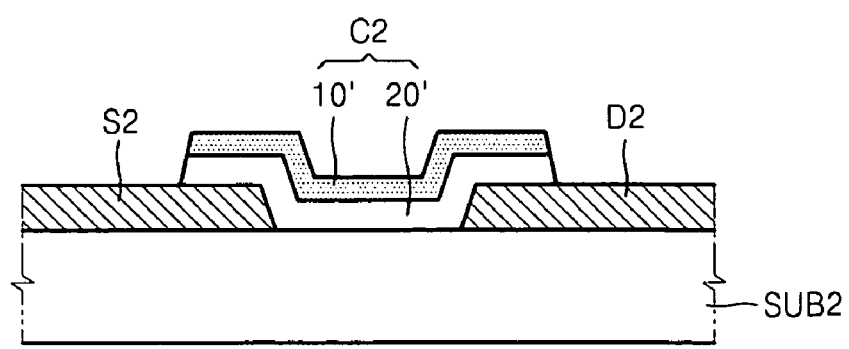
Figure 16C:
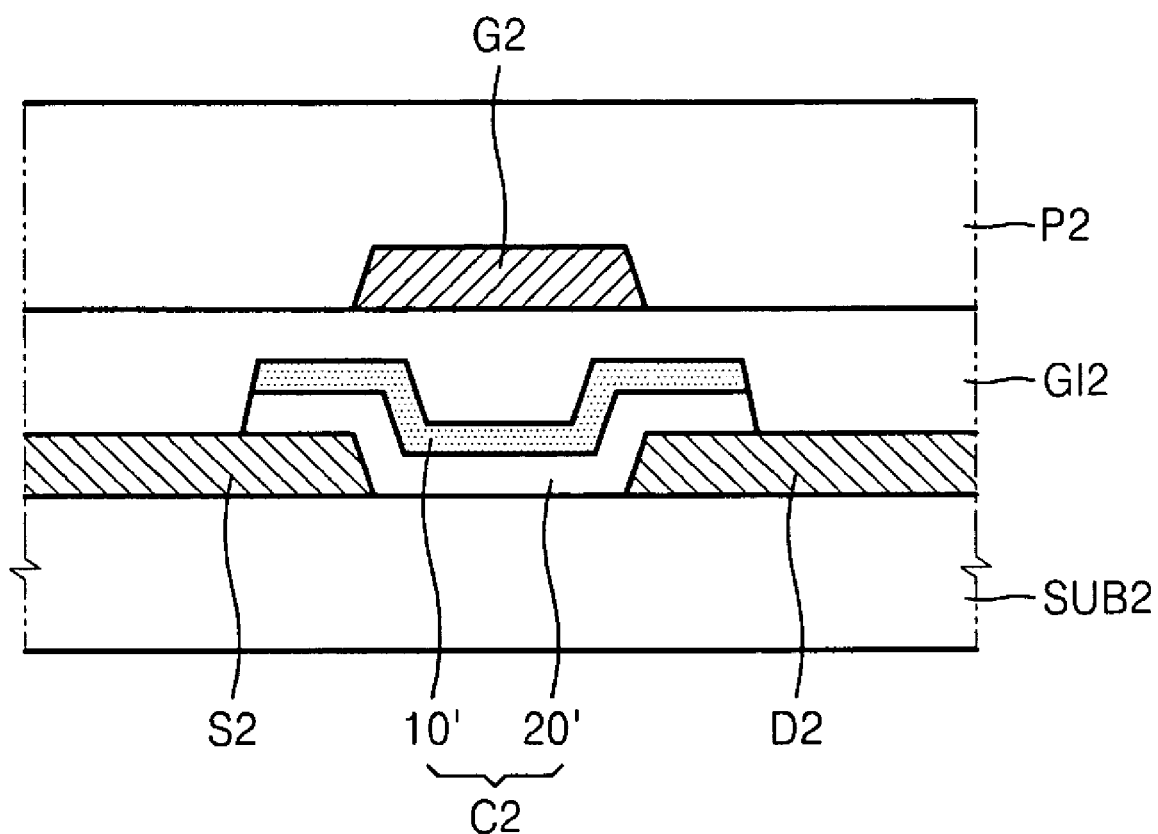

FIG. 16A through 16C are cross-sectional views sequentially showing a method of manufacturing a transistor according to example embodiments.

In FIGS. 16A through 16C, the transistor is a top gate thin-film transistor. In FIGS. 2 and 16A through 16C, like reference numerals denote like elements.

Referring to FIG. 16A, a source electrode S2 and a drain electrode D2 may be formed on a substrate SUB2 separate from each other.

Referring to FIG. 16B, a channel layer C2 may be formed on the substrate SUB2, the source electrode S2 and the drain electrode D2. The channel layer C2 may have compositions that vary in the deposition direction (in a direction from a bottom surface to a top surface, or vice versa) of the channel layer C2. The channel layer C2 may be similar to an inverted structure of the channel layer C1 of FIG. 15B. For example, the channel layer C2 may have a double-layered structure including a second layer 20' and a first layer 10' formed sequentially on the substrate SUB2. The first and second layers 10' and 20' may be respectively the same as, or similar to, the first and second layers 10 and 20 of FIG. 15B. Thus, the materials, forming methods and thicknesses of the first and second layers 10' and 20' may be the same as those of the first and second layers 10 and 20 of FIG. 15B.

Referring to FIG. 16C, a gate insulating layer GI2 may be formed to cover the channel layer C2, the source electrode S2 and the drain electrode D2. The gate insulating layer GI2 may be the same as the gate insulating layer GI1 of FIG. 15A. A gate G2 may be formed on the gate insulating layer GI2. The gate G2 may be formed over the channel layer C2. The gate G2 may be formed of the same, or a different, metal as that of the source electrode S2 and the drain electrode D2. A passivation layer P2 may be formed on the gate insulating layer GI2 to cover the gate G2. The passivation layer P2 may be formed of silicon oxide or silicon nitride. The passivation layer P2 may be a silicon oxide layer, a silicon nitride layer or an organic layer. The passivation layer P2 may have a structure in which at least two of these layers are stacked. The transistor manufactured using the above-described method may be annealed at a given (or set) temperature.

As described above, according to the above example embodiments, there is provided a transistor that may be used as a switching device or a driving device in flat panel display devices (e.g., liquid crystal display devices and organic light emitting display devices). Because a change in characteristics of the transistor by light is small, a flat panel display device including the transistor may have enhanced reliability. The structures of the liquid crystal display devices and the organic light emitting display devices are well known, and thus a detailed description thereof is not provided herein. The transistor according to example embodiments may be used for various applications in other electronic devices (e.g., memory devices and logic devices), in addition to the flat panel display devices.

It should be understood that the example embodiments described therein should be considered in a descriptive sense only and not for purposes of limitation. For example, it will be understood by one of ordinary skill in the art that various changes and modifications in elements and structures of transistors of FIGS. 1 and 2 may be made therein. In particular, the transistors of FIGS. 1 and 2 may have a double gate structure, and the channel layers thereof may each have a multi-layered structure including at least three layers. When a channel layer has a multi-layered structure including at least three layers, the amount of at least one of a first element (Hf, Ga, etc.), a second element (In), and Zn may be changed. In addition, the channel layer may have a flat surface structure, not have a curved shape. The methods of manufacturing the transistors illustrated in FIGS. 15 through 15C and 16A through 16C may be variously changed. In addition, it will be understood by one of ordinary skill in the art that the teachings may be applied to other transistors, in addition to thin-film transistors. Therefore, the spirit and scope of the present invention may be defined not by the example embodiments thereof but by the appended claims.

What is claimed is:

1. A transistor, comprising:
   a channel layer formed of an oxide including indium (In), zinc (Zn) and a first element, the first element being a metal element, wherein an amount of at least one of the first element, indium and zinc in the channel layer is changed in a deposition direction of the channel layer;
   a source and a drain respectively contacting opposing ends of the channel layer;
   a gate corresponding to the channel layer; and
   a gate insulating layer between the channel layer and the gate,
   wherein the first element is at least one selected from the group consisting of hafnium (Hf), yttrium (Y), tantalum (Ta), zirconium (Zr), gallium (Ga), aluminum (Al) and combinations thereof, and
   wherein the amount of the first element in the channel layer increases towards the gate.

2. The transistor of claim 1, wherein the oxide includes HfInZnO.

3. The transistor of claim 1, wherein the amount of indium (In) in the channel layer decreases towards the gate.

4. The transistor of claim 3, wherein the amount of Zn in the channel layer increases towards the gate.

5. The transistor of claim 1, wherein the amount of Zn in the channel layer increases towards the gate.

6. The transistor of claim 1, wherein the gate is below the channel layer, and the source and drain contact portions of a top surface of the channel layer.

7. The transistor of claim 1, wherein the gate is above the channel layer, and the source and drain contact portions of a bottom surface of the channel layer.

8. A flat panel display device, comprising the transistor of claim 1.

9. A transistor, comprising:
   a channel layer formed of an oxide including indium (In), zinc (Zn) and a first element, the first element being a metal element, wherein the channel layer has a multi-layered structure including a first layer and a second layer, the first element is in the first layer and the second layer, an amount of at least one of the first element, indium and zinc in the first layer is different than that in the second layer, and the amount of the first element in the first layer is greater than that in the second layer;
   a source and a drain respectively contacting opposing ends of the channel layer;
   a gate corresponding to the channel layer; and
   a gate insulating layer between the channel layer and the gate,
   wherein the first layer is closer to the gate than the second layer, and the second layer contacts the source and the drain.

10. The transistor of claim 9, wherein the first element is one selected from the group consisting of hafnium (Hf), yttrium (Y), tantalum (Ta), zirconium (Zr), gallium (Ga), aluminum (Al) and combinations thereof.

11. The transistor of claim 9, wherein the oxide includes HfInZnO.

12. The transistor of claim 9, wherein the amount of indium (In) is greater in the second layer than the first layer.

13. The transistor of claim 12, wherein the amount of Zn is greater in the first layer than the second layer.

14. The transistor of claim 9, wherein the amount of Zn is greater in the first layer than the second layer.

15. The transistor of claim 9, wherein the first layer has a thickness in the range of about 1-nm to about 30-nm.

16. The transistor of claim 9, wherein the second layer has a thickness in the range of about 30-nm to about 100-nm.

17. The transistor of claim 9, wherein the gate is below the channel layer, and the source and drain contact portions of a top surface of the channel layer.

18. The transistor of claim 9, wherein the gate is above the channel layer, and the source and drain contact portions of a bottom surface of the channel layer.

19. A flat panel display device, comprising the transistor of claim 9.

20. A transistor, comprising:
   a channel layer formed of an oxide including indium (In), zinc (Zn) and a first element, the first element being a metal element, wherein an amount of at least one of the first element, indium and zinc in the channel layer is changed in a deposition direction of the channel layer, and the channel layer is a single layer;
   a source and a drain respectively contacting opposing ends of the channel layer;
   a gate corresponding to the channel layer; and
   a gate insulating layer between the channel layer and the gate.

21. A transistor, comprising:
   a channel layer formed of an oxide including indium (In), zinc (Zn) and a first element, the first element being a metal element, wherein an amount of at least one of the first element, indium and zinc in the channel layer is changed in a deposition direction of the channel layer;
   a source and a drain respectively contacting opposing ends of the channel layer;
   a gate corresponding to the channel layer; and
   a gate insulating layer between the channel layer and the gate,
   wherein the amount of indium (In) in the channel layer decreases towards the gate.

22. The transistor of claim 21, wherein the amount of zinc (Zn) in the channel layer increases towards the gate.

23. The transistor of claim 21, wherein the first element is at least one selected from the group consisting of hafnium (Hf), yttrium (Y), tantalum (Ta), zirconium (Zr), gallium (Ga), aluminum (Al) and combinations thereof.

24. A transistor, comprising:

a channel layer formed of an oxide including indium (In), zinc (Zn) and a first element, the first element being a metal element, wherein the channel layer has a multi-layered structure including a first layer and a second layer, the first element is in the first layer and the second layer, and an amount of indium in the second layer is greater than that in the first layer;

a source and a drain respectively contacting opposing ends of the channel layer;

a gate corresponding to the channel layer; and a gate insulating layer between the channel layer and the gate, wherein the first layer is closer to the gate than the second layer, and the second layer contacts the source and the drain.

25. The transistor of claim 24, wherein the amount of zinc (Zn) in the first layer is greater than that of the second layer.

26. The transistor of claim 24, wherein the first element is one selected from the group consisting of hafnium (Hf), yttrium (Y), tantalum (Ta), zirconium (Zr), gallium (Ga), aluminum (Al) and combinations thereof.

* * * * *